US010818335B2

(12) United States Patent
Lin et al.

(10) Patent No.: US 10,818,335 B2
(45) Date of Patent: Oct. 27, 2020

(54) MEMORY STORAGE APPARATUS AND OPERATING METHOD WITH MULTIPLE MODES FOR REFRESH OPERATION

(71) Applicant: Winbond Electronics Corp., Taichung (TW)

(72) Inventors: Che-Min Lin, Taichung (TW); Hsi-Yuan Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/453,913

(22) Filed: Mar. 9, 2017

(65) Prior Publication Data
US 2018/0061473 A1  Mar. 1, 2018

(30) Foreign Application Priority Data

Aug. 30, 2016 (CN) .......................... 2016 1 0764924

(51) Int. Cl.
*G11C 11/406* (2006.01)
*G11C 7/10* (2006.01)
(Continued)

(52) U.S. Cl.
CPC .......... *G11C 11/406* (2013.01); *G11C 7/1045* (2013.01); *G11C 11/4074* (2013.01);
(Continued)

(58) Field of Classification Search
CPC .............. G11C 11/406; G11C 11/4094; G11C 11/4099; G11C 11/4074; G11C 11/4091;
(Continued)

(56) References Cited

U.S. PATENT DOCUMENTS 5,365,487 A * 11/1994 Patel ...................... G11C 5/143
                                                      365/222
5,966,725 A * 10/1999 Tabo .................. G06F 13/1636
                                                      711/106
(Continued)

FOREIGN PATENT DOCUMENTS

CN        101228633       7/2008
TW        I257627         7/2006

OTHER PUBLICATIONS

"Office Action of China Counterpart Application," dated Nov. 25, 2019, p. 1-p. 6.

*Primary Examiner* — Sultana Begum
(74) *Attorney, Agent, or Firm* — JCIPRNET

(57) ABSTRACT

A memory storage apparatus having a plurality of operating modes is provided. The memory storage apparatus includes a memory control circuit and a memory cell array circuit. The memory control circuit controls the memory storage apparatus to operate in one of the operating modes. The memory control circuit controls the memory storage apparatus to operate in a first operating mode and controls the memory storage apparatus to switch from the first operating mode to a second operating mode to refresh storage data of the memory cell array circuit. The memory storage apparatus operates in a third operating mode to refresh storage data in the memory storage apparatus. An operating voltage of the memory storage apparatus operating in the second operating mode is smaller than an operating voltage of the memory storage apparatus operating in the third operating mode.

18 Claims, 2 Drawing Sheets

(51) Int. Cl.
    *G11C 11/4074*     (2006.01)
    *G11C 11/4091*     (2006.01)
    *G11C 11/4099*     (2006.01)
    *G11C 11/4094*     (2006.01)

(52) U.S. Cl.
    CPC ...... *G11C 11/4091* (2013.01); *G11C 11/4099* (2013.01); *G11C 11/4094* (2013.01); *G11C 2211/4068* (2013.01)

(58) Field of Classification Search
    CPC ........... G11C 7/12; G11C 7/22; G11C 7/1048; G11C 7/00
    See application file for complete search history.

(56) References Cited

U.S. PATENT DOCUMENTS

| | | | |
|---|---|---|---|
| 6,243,315 B1 | 6/2001 | Goodman | |
| 6,426,908 B1* | 7/2002 | Hidaka | G11C 5/14 365/222 |
| 9,030,895 B2* | 5/2015 | Miura | G06F 13/4217 365/189.18 |
| 2001/0006483 A1* | 7/2001 | Ohshima | G11C 7/1045 365/233.1 |
| 2002/0191466 A1 | 12/2002 | Hwang et al. | |
| 2004/0151050 A1 | 8/2004 | Ooishi | |
| 2006/0087903 A1 | 4/2006 | Riho et al. | |
| 2007/0002657 A1* | 1/2007 | Shim | G11C 29/50 365/222 |
| 2008/0092016 A1 | 4/2008 | Pawlowski | |
| 2009/0180341 A1* | 7/2009 | Ide | H03K 5/15066 365/203 |
| 2014/0254254 A1* | 9/2014 | Katayama | G11C 11/16 365/158 |
| 2015/0098289 A1 | 4/2015 | Saito et al. | |
| 2015/0179249 A1* | 6/2015 | Park | G11C 11/40615 365/207 |

\* cited by examiner

MEMORY STORAGE APPARATUS AND OPERATING METHOD WITH MULTIPLE MODES FOR REFRESH OPERATION

CROSS-REFERENCE TO RELATED APPLICATION

This application claims the priority benefit of China application serial no. 201610764924.8, filed on Aug. 30, 2016. The entirety of the above-mentioned patent application is hereby incorporated by reference herein and made a part of this specification.

BACKGROUND

Field of the Invention

The invention relates to a storage apparatus and an operating method thereof and more particularly, to a memory storage apparatus and an operating method thereof.

Description of Related Art

In a dynamic random access memory (DRAM), an amount of charges stored in a capacitor is used to represent "1" or "0" of a binary bit, so that each memory cell of the DRAM at least requires one capacitor and one switch (or one transistor) for storing data. During an actual operation, the capacitors in the DRAM may have an electric leakage phenomenon, which may cause an insufficient potential difference of the capacitors, so that data stored in the DRAM can be disappeared. Therefore, the DRAM has to enter a refresh mode to periodically refresh (which can also be referred to as data charging/data refreshing) all of the memory cells, so as to ensure correctness of information stored in the DRAM. However, as applications of portable equipment become popular, devices with low power consumption have been highly valued. Thus, how to provide a memory storage apparatus and an operating method thereof capable of saving power and maintaining data has become an important issue for technicians in this field.

SUMMARY

The invention provides a memory storage apparatus and an operating method thereof, capable of saving power and maintaining data.

A memory storage apparatus of an embodiment of the invention has a plurality of operating modes. The memory storage apparatus includes a memory control circuit and a memory cell array circuit. The memory control circuit is configured to control the memory storage apparatus to operate in one of the operating modes. The memory cell array circuit is electrically connected to the memory control circuit. The memory cell array circuit is configured to store data. The memory storage apparatus receives a power source to operate in one of the operating modes. The memory control circuit controls the memory storage apparatus to operate in a first operating mode and controls the memory storage apparatus to switch from the first operating mode to a second operating mode to refresh storage data in the memory cell array circuit. The memory storage apparatus operates in a third operating mode to refresh storage data in the memory storage apparatus. An operating voltage of the memory storage apparatus operating in the second operating mode is smaller than an operating voltage of the memory storage apparatus operating in the third operating mode.

In an embodiment of the invention, the memory control circuit controls the memory storage apparatus to switch from the first operating mode to the third operating mode to refresh the storage data in the memory storage apparatus.

In an embodiment of the invention, a switching time of the memory storage apparatus switching from the second operating mode back to the first operating mode is larger than a switching time of the memory storage apparatus switching from the third operating mode back to the first operating mode.

In an embodiment of the invention, the memory control circuit controls the memory storage apparatus to switch from the first operating mode to a fourth operating mode. In the fourth operating mode, the storage data in the memory storage apparatus is not refreshed.

In an embodiment of the invention, the switching time of the memory storage apparatus switching from the second operating mode back to the first operating mode is smaller than a switching time of the memory storage apparatus switching from the fourth operating mode back to the first operating mode.

In an embodiment of the invention, when the memory storage apparatus operates in the first operating mode, a plurality of memory banks in the memory cell array circuit have been pre-charged.

In an embodiment of the invention, the operating voltage is selected from at least one of a main voltage, a bit line equalizer control voltage, a word line enable high voltage and an absolute value of a p-type well voltage.

In an embodiment of the invention, when the memory storage apparatus operates in the second operating mode, a reference voltage of an input/output (I/O) circuit in the memory storage apparatus and a reference voltage configured to generate a bit line equalizer control voltage are disabled.

An operating method of a memory storage apparatus of an embodiment of the invention includes: turning on a power source of the memory storage apparatus to operate the memory storage apparatus in a first operating mode; and switching the memory storage apparatus from the first operating mode to a second operating mode to refresh the storage data in the memory storage apparatus. The memory storage apparatus operates in a third operating mode to refresh storage data in the memory storage apparatus. An operating voltage of the memory storage apparatus operating in the second operating mode is smaller than an operating voltage of the memory storage apparatus operating in the third operating mode.

In an embodiment of the invention, the operating voltage is selected from at least one of a main voltage, a bit line equalizer control voltage, a word line enable high voltage and an absolute value of a p-type well voltage.

In an embodiment of the invention, when the memory storage apparatus operates in the second operating mode, a reference voltage of an I/O circuit in the memory storage apparatus and a reference voltage configured to generate a bit line equalizer control voltage are disabled.

In an embodiment of the invention, the operating method further includes: controlling the memory storage apparatus to switch from the first operating mode to the third operating mode to refresh the storage data in the memory storage apparatus.

In an embodiment of the invention, a switching time of the memory storage apparatus switching from the second operating mode back to the first operating mode is larger than a switching time of the memory storage apparatus switching from the third operating mode back to the first operating mode.

In an embodiment of the invention, the operating method further includes: controlling the memory storage apparatus to switch from the first operating mode to a fourth operating mode, wherein the storage data in the memory storage apparatus is not refreshed in the fourth operating mode.

In an embodiment of the invention, a switching time of the memory storage apparatus switching from the second operating mode back to the first operating mode is smaller than a switching time of the memory storage apparatus switching from the fourth operating mode back to the first operating mode.

In an embodiment of the invention, the memory storage apparatus includes a memory cell array circuit. When the memory storage apparatus operates in the first operating mode, a plurality of memory banks in the memory cell array circuit have been pre-charged.

To sum up, in exemplary embodiments of the invention, the operating voltage of the memory storage apparatus operating in the second operating mode is smaller than the operating voltage of the memory storage apparatus operating in the third operating mode. Thus, the memory storage apparatus and the operating method thereof can save power and maintain data.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Embodiments are provided below to describe the invention in detail, though the invention is not limited to the provided embodiments. Similarly, the provided exemplary embodiments can be suitably combined. The term "coupling/coupled" used in this specification (including claims) of the present application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 1:
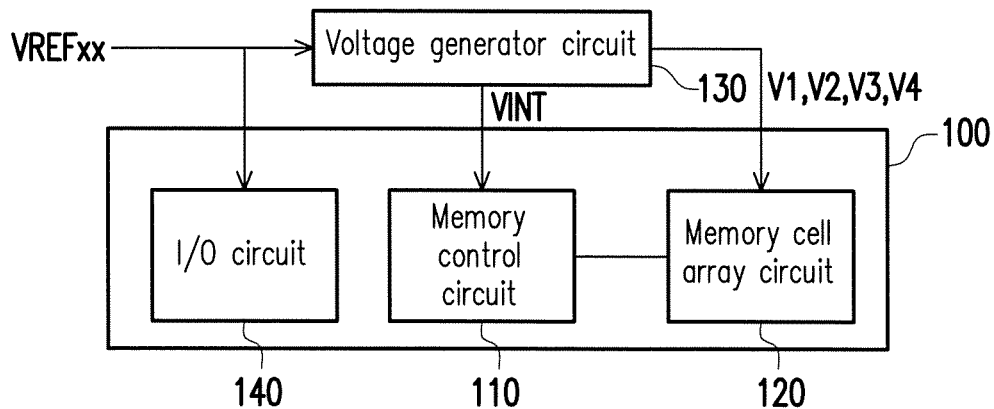
FIG. 1 is a schematic diagram illustrating a memory storage apparatus according to an embodiment of the invention.
Figure 2:
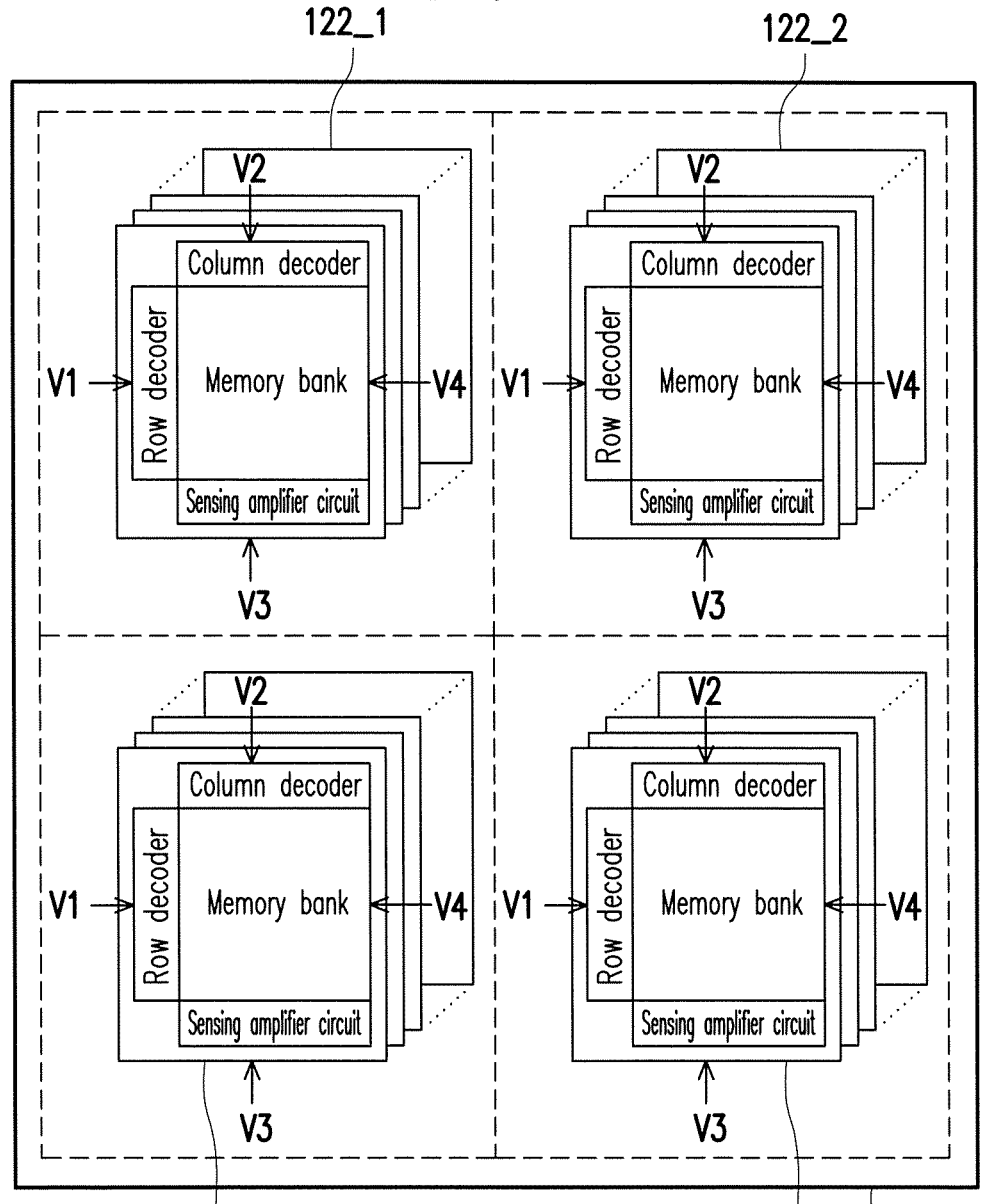
FIG. 2 is a schematic diagram illustrating the memory cell array circuit of the embodiment depicted in FIG. 1.

FIG. 1 is a schematic diagram illustrating a memory storage apparatus according to an embodiment of the invention. FIG. 2 is a schematic diagram illustrating the memory cell array circuit of the embodiment depicted in FIG. 1. Referring to FIG. 1 to FIG. 2, a memory storage apparatus 100 of the present embodiment includes a memory control circuit 110, a memory cell array circuit 120 and an input/output (I/O) circuit 140. In the present embodiment, the memory control circuit 110 is configured to control the memory storage apparatus 100 to operate in one of a plurality of operating modes. The memory cell array circuit 120 is electrically connected to the memory control circuit 110. The memory cell array circuit 120 is configured to store data. The I/O circuit 140 is electrically connected to the memory control circuit 110 and the memory cell array circuit 120. The I/O circuit 140 is configured to receive data to be written or output data to be read.

In the present embodiment, the memory control circuit unit 110 includes various circuit function blocks. For example, the memory cell array circuit 110 includes circuit function blocks configured to control data access of the memory cell array circuit 120, such as a clock buffer circuit, a command decoder circuit, a control signal oscillator circuit, an access buffer circuit, a mode register circuit, a refresh counter circuit, a column counter circuit, a data buffer circuit, a data control circuit, etc. In an embodiment, the aforementioned circuits are implemented by, for example, a logic circuit architecture, and corresponding circuit functions are performed according to a main voltage VINT used by the logic circuit. Thus, in FIG. 1, the memory control circuit 110 receives the main voltage VINT to control the memory storage apparatus 100 to operate in one of the plurality of operating modes.

In the present embodiment, the main voltage VINT is generated by a voltage generator circuit 130 according to a reference signal VREFxx, for example. The voltage generator circuit 130 includes, for example, one or more voltage generators. The voltage generator circuit 130 may be arranged inside or outside the memory storage apparatus 100, which is not limited in the invention. In the present embodiment, the I/O circuit 140 performs operations, such as data input, data output, and so on, according to the reference signal VREFxx. The reference signal VREFxx includes, for example, a reference voltage of the I/O circuit 140.

Referring to FIG. 2, in the present embodiment, the memory cell array circuit 120 includes, for example, 4 memory banks 122_1 to 122_4. However, the number is merely described for example, and the invention is not limited thereto. Taking the memory bank 122_1 as an example, an operating voltage thereof is a voltage signal V4. Operating voltages of a row decoder 221 and a column decoder of the memory bank 122_1 are, for example, voltage signals V1 and V2. In the present embodiment, the memory bank 122_1 is arranged in a p-type well region of its substrate, for example. The substrate and its P-type well region receive a voltage signal V3.

In the present embodiment, the voltage signals (operating voltages) V1 to V4 are generated by the voltage generator circuit 130 according to the reference signal VREFxx, for example. In the present embodiment, the voltage signal V1 includes, for example, a word line enable high voltage. The voltage signals V2 and V3 include, for example, a bit line equalizer control voltage and a bit line high level voltage. The voltage signal V4 includes, for example, a bit line equalizer control voltage, a p-type well voltage and a bit line high level voltage.

In the present embodiment, operating voltages of the circuits in the memory control circuit 110 and the memory cell array circuit 120 are generated according to different reference voltages, for example. Thus, the reference signal VREFxx includes, for example, a reference voltage of the I/O circuit 140, a reference voltage configured for generating the bit line equalizer control voltage, a reference voltage configured for generating the main voltage VINT, a reference voltage configured for generating the word line enable high voltage or the like. For example, in order to stabilize a memory chip, the reference voltage of each circuit is generated by, for example, several reference voltage sources which do not interfere with one another. However, the method for generating the reference voltage does not limit the invention.

In the present embodiment, the circuit structure of each circuit function block in the memory control circuit 110, the memory cell array circuit 120, the voltage generator circuit 130 and the I/O circuit 140 may be implemented by any adaptive circuits in the related art, which is not limited in the invention. Enough teaching, suggestion, and implementation illustration for aforesaid steps and embodiments thereof may be obtained with reference to common knowledge in the related art, which is not repeated hereinafter.

Figure 3:
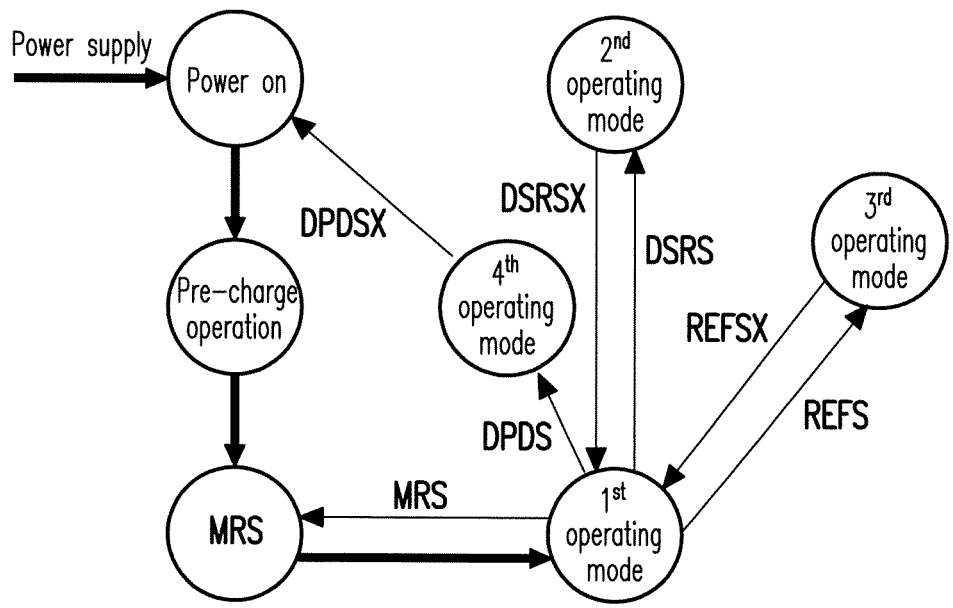
FIG. 3 is a schematic diagram illustrating the memory cell array circuit of the embodiment depicted in FIG. 1 switching among different modes.

FIG. 3 is a schematic diagram illustrating the memory cell array circuit of the embodiment depicted in FIG. 1 switching among different modes. Referring to FIG. 1 to FIG. 3, the memory storage apparatus 100 of the present embodiment operates in one of a plurality of operating modes. In an embodiment, the plurality of operating modes include, for example, but not limited to, an idle mode, a deep self refresh mode (DSR mode), a self refresh mode (SR mode) and a deep power down mode (DPD mode). Hereinafter, the idle mode, the DSR mode, the SR mode and the DPD mode respectively serve as a first operating mode, a second operating mode, a third operating mod and a fourth operating mode as an example for description.

In the present embodiment, the memory storage apparatus 100 receives a power source to enter an on state to operate in one of the aforementioned operating modes. After the power source is turned on, the memory control circuit 110 performs a pre-charge operation on the memory cell array circuit 120 to pre-charge and activate memory banks before accessing the memory banks. After the pre-charge operation is performed, the memory control circuit 110 performs a mode register set (MRS) operation on the memory cell array circuit 120. In an embodiment, in a double data rate synchronous dynamic random access memory (DDR SDRAM), for example, the memory control circuit 110 further performs an extended mode register set (EMRS) operation on the memory cell array circuit 120. After the MRS operation is performed, the memory control circuit 110 controls the memory storage apparatus 100 to operate in the first operating mode, i.e. the idle mode. In the first operating mode, a plurality of memory banks in the memory cell array circuit 120 have been pre-charged. In the first operating mode, the memory control circuit 110 repeatedly performs the MRS operation on the memory storage apparatus 100 according to an instruction MRS, for example.

In the present embodiment, the memory control circuit 110 controls the memory storage apparatus 100 to switch to different operating modes according to different instructions. For example, the memory control circuit 110 controls the memory storage apparatus 100 to switch from the first operating mode to the second operating mode, i.e. the DSR mode, according to an instruction DSRS. In the second operating mode, the memory control circuit 110 refreshes storage data in the memory cell array circuit 120. In the second operating mode, the memory control circuit 110 controls the memory storage apparatus 100 to switch from the second operating mode back to the first operating mode according to an instruction DSRSX, for example, and a switching time thereof is, for example, 20 microseconds (μs). However, the length of the switching time is merely described herein for example, and the invention is not limited thereto.

In the present embodiment, the memory control circuit 110 controls the memory storage apparatus 100 to switch from the first operating mode to the third operating mode, i.e. the SR mode, according to an instruction REFS, for example. In the third operating mode, the memory control circuit 110 refreshes the storage data in the memory cell array circuit 120. In the third operating mode, the memory control circuit 110 controls the memory storage apparatus 100 to switch from the third operating mode back to the first operating mode according to an instruction REFSX, for example, and a switching time thereof is, for example, 0.12 μs. However, the length of the switching time is merely described herein for example, and the invention is not limited thereto. Thus, in the present embodiment, a switching time of the memory storage apparatus 100 switching from the second operating mode back to the first operating mode is larger than a switching time of the memory storage apparatus 100 switching from the third operating mode back to the first operating mode.

In the present embodiment, the memory control circuit 110 controls the memory storage apparatus 100 to switch from the first operating mode to the fourth operating mode, i.e. the DPD mode, according to an instruction DPDS, for example. In the fourth operating mode, the memory control circuit 110 does not refresh the storage data in the memory cell array circuit 120. In other words, when the memory cell array circuit 120 is temporarily not required, the memory storage apparatus 100 enters a sleep state, and does not refresh the storage data. In the fourth operating mode, the memory control circuit 110 controls the memory storage apparatus 100 to switch from the fourth operating mode back to the first operating mode, for example, according to an instruction DPDSX, and a switching time thereof is, for example, 200 μs. However, the length of the switching time is merely described herein for example, and the invention is not limited thereto. During the process of switching from the fourth operating mode back to the first operating mode, the memory storage apparatus 100 is switched back to the first operating mode after going through the on state, the pre-charge operation and the mode register set operation. Thus, in the present embodiment, the switching time of the memory storage apparatus 100 switching from the second operating mode back to the first operating mode is smaller than a switching time of the memory storage apparatus 100 switching from the fourth operating mode back to the first operating mode.

In the present embodiment, compared to the third operating mode, an operating voltage of the memory storage apparatus 100 operating in the second operating mode is smaller than an operating voltage of the memory storage apparatus 100 operating in the third operating mode. For example, the main voltage VINT of the memory storage apparatus 100 operating in the second operating mode is smaller than the main voltage VINT of the memory storage apparatus 100 operating in the third operating mode. Alternatively, the bit line equalizer control voltage of the memory storage apparatus 100 operating in the second operating mode is smaller than the bit line equalizer control voltage of the memory storage apparatus 100 operating in the third operating mode. Alternatively, the word line enable high voltage of the memory storage apparatus 100 operating in the second operating mode is smaller than the word line enable high voltage of the memory storage apparatus 100 operating in the third operating mode. Alternatively, an absolute value of the p-type well voltage of the memory storage apparatus 100 operating in the second operating mode is smaller than an absolute value of the p-type well voltage of the memory storage apparatus 100 operating in the third operating mode. The setting of reducing the operating voltage in the second operating mode may be selectively performed on one or more of the voltage simultaneously, which is not limited in the invention. Thus, the memory storage apparatus 100 of the present embodiment can save power and maintain data.

In the present embodiment, compared to the third operating mode, in the second operating mode, a reference voltage of the I/O circuit 140 in the memory storage apparatus and a reference voltage configured to generate a bit line equalizer control voltage disabled are disabled. Thus, the memory storage apparatus 100 of the present embodiment can save power and maintain data. In the present embodiment, compared to the third operating mode, the bit line equalizer control voltage and the bit line high level voltage may be set to a floating state in the second operating mode. Thus, the memory storage apparatus 100 of the present embodiment can save power and maintain data.

Generally, a memory chip is usually provided with a security circuit. When an external voltage (e.g. a power source) of the memory chip is overly low, the security circuit automatically restarts according to a power on block signal, so as to ensure that internal signal settings of the memory chip have no error. In an embodiment, compared to the third operating mode, the power on block signal may be, for example, disabled in the second operating mode. Thus, the memory storage apparatus 100 of the present embodiment can save power and maintain data.

Figure 4:
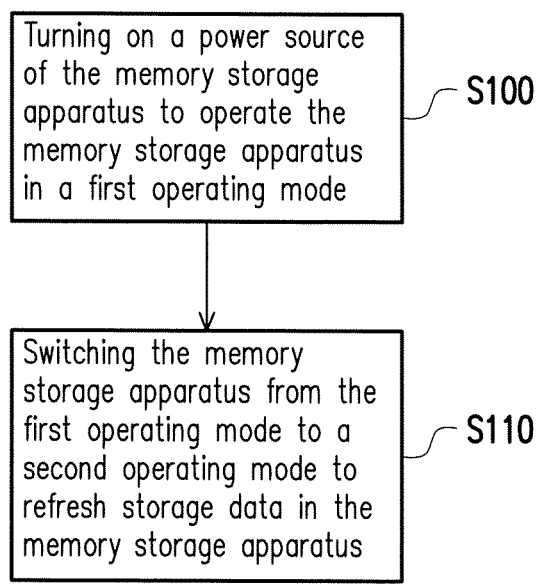
FIG. 4 is a flowchart of an operating method of a memory storage apparatus according to an embodiment of the invention.

FIG. 4 is a flowchart of an operating method of a memory storage apparatus according to an embodiment of the invention. Referring to FIG. 1 and FIG. 4, an operating method of the present embodiment is at least adapted to the memory storage apparatus 100 illustrated in FIG. 1. However, the invention is not limited thereto. Taking the memory storage apparatus 100 illustrated in FIG. 1 as an example, in step S100, a power source of the memory storage apparatus 110 is turned on to operate the memory storage apparatus 100 in a first operating mode. In step S110, the memory storage apparatus 100 is switched from the first operating mode to a second operating mode to refresh storage data in the memory storage apparatus 100. In the present embodiment, an operating voltage of the memory storage apparatus 100 operating in the second operating mode is smaller than an operating voltage of the memory storage apparatus 100 operating in a third operating mode.

Besides, the operating method of the memory storage apparatus described in the present embodiment of the invention is sufficiently taught, suggested, and embodied in the embodiments illustrated in FIG. 1 to FIG. 3, and therefore no further description is provided herein.

Based on the above, in the exemplary embodiments of the invention, the second operating mode which is different from the third operating mode is established. The setting of reducing the operating voltage in the second operating mode may be selectively performed on one or more of the voltage simultaneously. Thus, the operating voltage of the memory storage apparatus operating in the second operating mode is smaller than the operating voltage of the memory storage apparatus operating in the third operating mode. In the second operating mode, part of the reference voltages may also be selectively turned off. Thus, the memory storage apparatus and the operating method thereof can save power and maintain data.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A memory storage apparatus, having a plurality of operating modes, and comprising:
    a memory control circuit, configured to control the memory storage apparatus to operate in one of the operating modes; and
    a memory cell array circuit, electrically connected to the memory control circuit and configured to store data,
    wherein the memory storage apparatus receives a power source to operate in one of the operating modes, the memory control circuit controls the memory storage apparatus to operate in a first operating mode, and controls the memory storage apparatus to switch from the first operating mode to a second operating mode to refresh storage data in the memory cell array circuit,
    wherein the memory storage apparatus operates in a third operating mode to refresh storage data in the memory storage apparatus, and an operating voltage of the memory storage apparatus operating in the second operating mode is smaller than an operating voltage of the memory storage apparatus operating in the third operating mode, wherein the second operating mode and the third operating mode are refresh modes that have different operating voltages,
    wherein the operating voltage is selected from at least one of a bit line equalizer control voltage and an absolute value of a p-type well voltage,
    wherein the second operating mode is a deep self refresh mode, and the third operating mode is a self refresh mode; and
    wherein the bit line equalizer control voltage is set to a floating state in the second operating mode.

2. The memory storage apparatus according to claim 1, wherein the memory control circuit controls the memory storage apparatus to switch from the first operating mode to the third operating mode to refresh the storage data in the memory storage apparatus.

3. The memory storage apparatus according to claim 2, wherein a switching time of the memory storage apparatus switching from the second operating mode back to the first operating mode is larger than a switching time of the memory storage apparatus switching from the third operating mode back to the first operating mode.

4. The memory storage apparatus according to claim 1, wherein the memory control circuit controls the memory storage apparatus to switch from the first operating mode to a fourth operating mode, wherein the storage data in the memory storage apparatus is not refreshed in the fourth operating mode.

5. The memory storage apparatus according to claim 4, wherein a switching time of the memory storage apparatus switching from the second operating mode back to the first operating mode is smaller than a switching time of the memory storage apparatus switching from the fourth operating mode back to the first operating mode.

6. The memory storage apparatus according to claim 1, wherein when the memory storage apparatus operates in the first operating mode, a plurality of memory banks in the memory cell array circuit have been pre-charged.

7. The memory storage apparatus according to claim 1, wherein the operating voltage is further selected from at least one of a main voltage and a word line enable high voltage.

8. The memory storage apparatus according to claim 1, wherein when the memory storage apparatus operates in the second operating mode, a reference voltage of an input/output (I/O) circuit in the memory storage apparatus, and a reference voltage configured to generate a bit line equalizer control voltage are disabled.

9. An operating method of a memory storage apparatus, wherein the memory storage apparatus has a plurality of operating modes, the operating method comprising:
 turning on a power source of the memory storage apparatus to operate the memory storage apparatus in a first operating mode; and
 switching the memory storage apparatus from the first operating mode to a second operating mode to refresh storage data in the memory storage apparatus,
 wherein the memory storage apparatus operates in a third operating mode to refresh the storage data in the memory storage apparatus, and an operating voltage of the memory storage apparatus operating in the second operating mode is smaller than an operating voltage of the memory storage apparatus operating in the third operating mode, wherein the second operating mode and the third operating mode are refresh modes that have different operating voltages,
 wherein the operating voltage comprises an absolute value of a p-type well voltage,
 wherein the second operating mode is a deep self refresh mode, and the third operating mode is a self refresh mode; and
 wherein the bit line equalizer control voltage is set to a floating state in the second operating mode.

10. The operating method according to claim 9, wherein the operating voltage is further selected from at least one of a main voltage, a bit line equalizer control voltage, and a word line enable high voltage.

11. The operating method according to claim 9, wherein when the memory storage apparatus operates in the second operating mode, a reference voltage of an I/O circuit in the memory storage apparatus, and a reference voltage configured to generate a bit line equalizer control voltage are disabled.

12. The operating method according to claim 9, further comprising:
 controlling the memory storage apparatus to switch from the first operating mode to the third operating mode to refresh the storage data in the memory storage apparatus.

13. The operating method according to claim 12, wherein a switching time of the memory storage apparatus switching from the second operating mode back to the first operating mode is larger than a switching time of the memory storage apparatus switching from the third operating mode back to the first operating mode.

14. The operating method according to claim 9, further comprising:
 controlling the memory storage apparatus to switch from the first operating mode to a fourth operating mode, wherein the storage data in the memory storage apparatus is not refreshed in the fourth operating mode.

15. The operating method according to claim 14, wherein a switching time of the memory storage apparatus switching from the second operating mode back to the first operating mode is smaller than a switching time of the memory storage apparatus switching from the fourth operating mode back to the first operating mode.

16. The operating method according to claim 9, wherein the memory storage apparatus comprises a memory cell array circuit, and when the memory storage apparatus operates in the first operating mode, a plurality of memory banks in the memory cell array circuit have been pre-charged.

17. A memory storage apparatus, having a plurality of operating modes, and comprising:
 a memory control circuit, configured to control the memory storage apparatus to operate in one of the operating modes; and
 a memory cell array circuit, electrically connected to the memory control circuit and configured to store data,
 wherein the memory storage apparatus receives a power source to operate in one of the operating modes, the memory control circuit controls the memory storage apparatus to operate in an idle mode, and controls the memory storage apparatus to switch from the idle mode to a first self refresh mode to refresh storage data in the memory cell array circuit,
 wherein the memory storage apparatus operates in a second self refresh mode to refresh storage data in the memory cell array circuit, and an operating voltage of the memory storage apparatus operating in the first self refresh mode is smaller than an operating voltage of the memory storage apparatus operating in the second self refresh mode,
 wherein a switching time of the memory storage apparatus switching from the first self refresh mode back to the idle mode is larger than a switching time of the memory storage apparatus switching from the second self refresh mode back to the idle mode,
 wherein the operating voltage is selected from at least one of a main voltage, a bit line equalizer control voltage, a word line enable high voltage and an absolute value of a p-type well voltage,
 wherein the bit line equalizer control voltage and the bit line high level voltage are set to a floating state in the first self refresh.

18. The memory storage apparatus according to claim 17, wherein a power on block signal is disabled in the first self refresh.

* * * * *